(12) United States Patent
Cousins et al.

(10) Patent No.: US 10,941,028 B2
(45) Date of Patent: Mar. 9, 2021

(54) SAFETY SYSTEM

(71) Applicant: NIFTYLIFT LIMITED, Milton Keynes (GB)

(72) Inventors: Thomas Cousins, Milton Keynes (GB); Steven Redding, Milton Keynes (GB); Matthew Newman, Royston (GB); Charles Cooke, Royston (GB); David Tegerdine, Royston (GB); Ed Bean, Royston (GB)

(73) Assignee: NIFTYLIFT LIMITED, Milton Keynes (GB)

( * ) Notice: Subject to any disclaimer, the term of this patent is extended or adjusted under 35 U.S.C. 154(b) by 0 days.

(21) Appl. No.: 16/348,429

(22) PCT Filed: Nov. 7, 2017

(86) PCT No.: PCT/GB2017/053331
§ 371 (c)(1),
(2) Date: May 8, 2019

(87) PCT Pub. No.: WO2018/087524
PCT Pub. Date: May 17, 2018

(65) Prior Publication Data
US 2020/0062565 A1  Feb. 27, 2020

(30) Foreign Application Priority Data

Nov. 8, 2016  (GB) .................................... 1618831

(51) Int. Cl.
*G08B 21/00*  (2006.01)
*B66F 17/00*  (2006.01)
(Continued)

(52) U.S. Cl.
CPC .......... *B66F 17/006* (2013.01); *B66C 15/065* (2013.01); *G01R 29/08* (2013.01)

(58) Field of Classification Search
CPC ...... B66F 17/006; B66C 15/065; G01R 29/08
See application file for complete search history.

(56) References Cited

U.S. PATENT DOCUMENTS 4,277,744 A * 7/1981 Audone ............. G01R 29/0871
324/72
6,788,215 B1   9/2004 White
(Continued)

FOREIGN PATENT DOCUMENTS

JP   H03 227894 A   10/1991
JP   2000 241102 A   9/2000

OTHER PUBLICATIONS

International Search Report & Written Opinion, dated Jan. 8, 2018, in International Patent Application No. PCT/GB2017/053331.
(Continued)

*Primary Examiner* — Phung Nguyen
(74) *Attorney, Agent, or Firm* — Knobbe, Martens, Olson & Bear, LLP

(57) ABSTRACT

A safety system for an elevating machine has a base part and an elevating part. The safety system includes sensor assemblies for sensing an electric or magnetic field, which are mounted on different parts of the elevating machine. A data processor is connected to receive sensor signals from the sensor assemblies. A memory stores data relating to numerous patterns of sensor signals associated with the interaction between the elevating machine and an electric or magnetic field. The data processor compares the received sensor signals with the stored data and identifies the positional relationship between the elevating machine and a source of the sensed field.

21 Claims, 9 Drawing Sheets

(51) Int. Cl.
*B66C 15/06* (2006.01)
*G01R 29/08* (2006.01)

(56) References Cited

U.S. PATENT DOCUMENTS

| | | | |
|---|---|---|---|
| 2006/0139032 A1 | 6/2006 | Kalokitis | |
| 2013/0033258 A1* | 2/2013 | Parr | G01B 7/14 |
| | | | 324/207.22 |
| 2014/0239945 A1* | 8/2014 | Seabury | G08G 1/042 |
| | | | 324/244 |
| 2017/0107090 A1* | 4/2017 | Mondal | B66F 11/044 |

OTHER PUBLICATIONS

UK Intellectual Property Office Search Report, dated Apr. 28, 2017, in UK Patent Application No. GB 1618831.0.

* cited by examiner

Sensor 1: Medium

Sensor 2: Low

SAFETY SYSTEM

PRIORITY AND CROSS REFERENCE TO RELATED APPLICATIONS

This application is the U.S. National Stage Application under 35 U.S.C. § 371 of International Patent Application No. PCT/GB2017/053331, filed Nov. 7, 2017, designating the U.S. and published in English as WO 2018/087524 A1 on May 17, 2018, which claims the benefit of GB Patent Application No. GB 1618831.0, filed Nov. 8, 2016. Any and all applications for which a foreign or a domestic priority is claimed is/are identified in the Application Data Sheet filed herewith and is/are hereby incorporated by reference in their entirety under 37 C.F.R. § 1.57.

FIELD

The present invention relates to a safety system for an elevating machine, and to an elevating machine that has a safety system.

SUMMARY

The present invention relates to a safety system for an elevating machine, and to an elevating machine that has a safety system. The invention also relates to a sensing method for use in a safety system. In particular but not exclusively the invention relates to a safety system that is designed to protect the operator of an elevating machine from the risk of electrical shock, when working in the vicinity of overhead electrical power supply cables.

BRIEF DESCRIPTION OF THE DRAWINGS

Certain embodiments of the invention will now be described by way of example with reference to the accompanying drawings, wherein.

DETAILED DESCRIPTION

Figure 1:
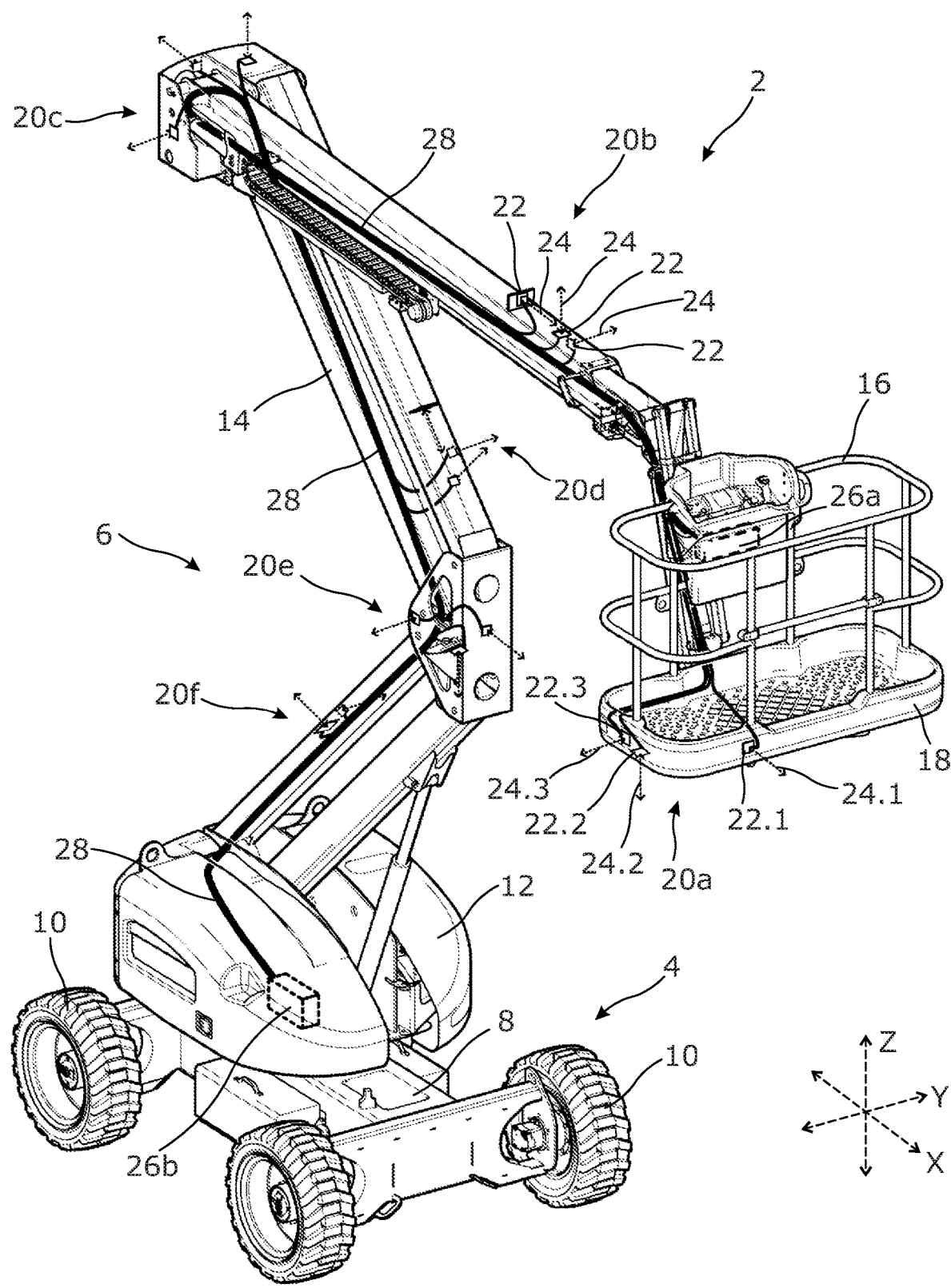
FIG. 1 is an isometric view of a mobile elevating work platform (MEWP) having a safety system according to an embodiment of the invention.

The term "elevating machine" as used herein means any machine that has a base part and an elevating part that is mounted on the base part and can be elevated relative to the base part. However, the invention is concerned primarily with mobile elevating machines that can be moved from one location to another, as the risk of accidentally touching a power supply cable is obviously greater when an elevating machine is used in a new location. A mobile elevating machine may for example have a base comprising a chassis and wheels or tracks, or the base may be supported on jacklegs, stabilisers or outriggers, in which case it may be lifted or carried from one location to another. In one embodiment the elevating machine is a Mobile Elevating Work Platform (MEWP) with a wheeled base part and an elevating part comprising a work platform attached to an elevating boom that is mounted on the base part and can be elevated relative to the base part, allowing an operator to work at an elevated height above the ground.

Although the invention is aimed primarily at MEWPs, it may be used on other elevating machines, such as forklift trucks, telescopic handlers, rescue vehicles, off highway construction and agricultural equipment. The term "elevating machine" as used herein is intended to cover all such machines. The invention also relates to a safety system that may be fitted as an attachment for use with such elevating machines.

Most overhead electric lines are uninsulated and usually carry high voltage electricity. Working from or moving a MEWP in the vicinity of overhead high voltage lines can be extremely dangerous, and it is recommended that a minimum safe distance must always be kept between the overhead lines and the closest point of the MEWP when fully extended.

There are devices available that are advertised as being able to detect proximity to an energised overhead power line. An example is described in GB 2288667B. Using electric field sensors, these devices are designed to sense the electric field that surrounds an overhead power line and warn when an induced voltage exceeds a threshold value. However, these devices can be unreliable and inaccurate for several reasons, including the presence of nearby conductors that mask the electric field from the sensors. These nearby conductors may include the structure of the MEWP, which can distort the electric field, and any persons near the detector. For similar reasons, detectors that indicate a change in the surrounding electric field can also be unreliable, as the field may distort when the MEWP moves.

The alerts from current technology are frequently false or unreliable, which can cause operators not to trust the alerts, resulting in them ignoring the warning device, or not using one.

Other examples of devices and their disadvantages are listed below:

Patent application WO 2008/102225 A2 describes a device for sensing electrical hazards that includes 'at least one' electric field sensor, which can be used to measure the field strength, implying multiple sensors could be used. It proposes that these sensors could be placed in various positions on the machine, and trigger with respect to a pre-determined threshold value. However, this approach fails to distinguish between a low voltage power line close up, and a high voltage power line far away. This patent application does not clearly explain the reason for providing more than one sensor and contains no detail regarding the method for processing the data from the sensors. Without processing the sensor data, the results would be unreliable due to the machine and other objects distorting the electric field.

WO 02/086519 A1 describes a safety device for mobile construction equipment using multiple sensors, but only mentions magnetic sensing and fails to mention an electric field sensor. Also, it only mentions that multiple sensors are used to determine positioning via relative field strengths. It does not indicate how to mitigate the risk of the MEWP influencing the readings to achieve an accurate warning.

Although the prior art devices mentioned above may detect the presence of electrical power lines, they are prone to generating false signals and are not capable of accurately sensing the direction of a power line and so cannot help an operator to determine a safe direction of movement to increase the distance from the power line.

It is mentioned in WO 02086519A1 that data from three spatially separated sensors could be analysed by a computer to calculate the approximate position of a power line. However, the distortion of the electric field from the elevating machine and other nearby conductors could cause the readings to be unreliable. It would also be unlikely to work reliably in the case of multiple power lines in the surrounding area.

Despite being available for decades, existing power line proximity warning devices have not found widespread acceptance, due to their technical, commercial, and operational limitations.

It is an object of this invention to provide a safety system for detecting electrical hazards that mitigates one or more of the aforesaid problems.

According to one aspect of the invention there is provided a safety system for an elevating machine having a base part and an elevating part that is mounted on the base part and can be elevated relative to the base part, wherein the safety system includes a plurality of sensor assemblies for sensing at least one field associated with an electric current or voltage, wherein the sensor assemblies are configured to be mounted on different parts of the elevating machine, at least one data processor that is connected to receive sensor signals from the sensor assemblies, wherein the data processor is configured to obtain an analysis by analysing the sensor signals based on learned data relating to numerous patterns of sensor signals associated with the interaction between the elevating machine and at least one field associated with an electric current or voltage, wherein the data processor is configured to determine from the analysis the positional relationship between the elevating machine and a source of the sensed field.

A field associated with an electric current or voltage may be an electric field (i.e. a field associated with an electric voltage) and/or a magnetic field (i.e. a field associated with an electric current). In most embodiments, the sensor assemblies are configured to sense an electric field. However, in some embodiments the sensor assemblies may be configured to sense a magnetic field, either in combination with an electric field or possibly instead of an electric field.

The safety system is able to estimate the positional relationship between the elevating machine and a source of the sensed field, such as an electrical power line, by comparing the sensor signals with the stored data and finding a close match. As the stored data is based on information obtained through field trials using an identical elevating machine, and/or computer simulations based on that machine, the effect of the structure of the elevating machine on the electric or magnetic field can be taken into account, allowing the position of the elevating machine relative to the source of the sensed field to be determined with great accuracy. This means that the system can determine, for example, the distance of the elevating machine from an electrical power line, and can generate an alarm signal or take other action such as restricting movement of the elevating machine, to ensure that no part of the machine approaches the power line too closely. Potentially hazardous situations, which could cause injury to an operator of the machine or damage to the machine, can thus be avoided.

The safety system may include an alarm device that is configured to provide an alarm signal when the data processor identifies a potentially hazardous situation from the positional relationship between the elevating machine and the source of the sensed field.

The safety system may include a control device that is configured to prevent or restrict operation of the elevating machine when the data processor identifies a potentially hazardous situation from the positional relationship between the elevating machine and the source of the sensed field. The control device may for example be configured to prevent further movement of the elevating machine, or to restrict movement of the machine (for example by restricting the speed of movement and/or by allowing movement only away from the electric or magnetic field source, so that the distance from the source of the sensed field increases, and/or by allowing only reverse movements of the machine), or to prevent movement of the machine unless the operator activates an override control.

In an embodiment, at least one of the sensor assemblies comprises a plurality of directional sensors, each having a different sensing axis. In an embodiment, at least one of the sensor assemblies comprises at least three directional sensors, having orthogonal sensing axes. The provision of a plurality of directional sensors allows the sensor assembly to determine both the distance and the direction of the source of the sensed field relative to the sensor assembly. It is not generally essential that all of the sensor assemblies comprise a plurality of directional sensors having a different sensing axis, and in some locations this may not be possible.

In an embodiment, the safety system includes at least three sensor assemblies, wherein at least one of the sensor assemblies is configured to be mounted on the base part of the elevating machine, and at least one of the sensor assemblies is configured to be mounted on the elevating part. The safety system may include more than three sensor assemblies, for example four, five, six or more sensor assemblies, located in different locations on the elevating machine, in order to determine the positional relationship between the elevating machine and the source of the sensed field with even greater accuracy.

In an embodiment, each sensor assembly includes at least one electric field sensor. Alternatively, or in addition, one or more of the sensor assemblies may include a magnetic field sensor.

In an embodiment, each sensor assembly includes an electrical filter, for example a band pass filter, which is configured to pass an alternating signal having a frequency in the range 50-60 Hz. This allows the sensor assembly to distinguish between electrical power lines (which usually carry an alternating electrical current with a frequency of 50 or 60 Hz) from other electric or magnetic field sources. Optionally, the filter may be configured to pass a broader band of frequencies: for example 40-70 Hz.

In an embodiment, the data processor is configured to identify from the received sensor signals the distance from the elevating machine to the source of the sensed field.

In an embodiment, the data processor is configured to identify from the received sensor signals the direction from the elevating machine to the source of the sensed field.

In a preferred embodiment, the data processor is configured to identify from the received sensor signals both the distance and the direction from the elevating machine to the source of the sensed field.

In a preferred embodiment, the memory stores data relating to the effects of various external factors on the received sensor signals, and the data processor is configured to compensate for the effect of these external factors. The external factors may include, for example, the effect of prevailing weather conditions on the sensor signals or the presence of external objects, such as people operating or located close to the elevating machine, passing vehicles, trees, lampposts and other objects.

According to another aspect of the invention there is provided an elevating machine having a base part and an elevating part that is mounted on the base part and can be elevated relative to the base part, and a safety system according to any one of the preceding statements of invention, wherein the sensor assemblies are mounted on different parts of the elevating machine.

In an embodiment, the elevating machine includes at least three sensor assemblies, wherein at least one of the sensor assemblies is mounted on the base part of the elevating machine, and at least one of the sensor assemblies is mounted on the elevating part.

In an embodiment, the elevating machine is a mobile elevating work platform, a forklift truck, a telescopic handlers, a rescue vehicles, an off highway construction vehicle or an agricultural machine.

In an embodiment, the elevating machine is a mobile elevating work platform having a base part and an elevating part that includes an operator platform, wherein at least one of the sensor assemblies is mounted on the operator platform.

According to another aspect of the invention there is provided a sensing method for use in a safety system for an elevating machine, the sensing method comprising sensing at least one field associated with an electric current or voltage by means of a plurality of sensor assemblies mounted on different parts of the elevating machine, receiving sensor signals from the sensor assemblies, obtaining an analysis by analysing the sensor signals based on learned data relating to numerous patterns of sensor signals associated with the interaction between the elevating machine and at least one field associated with an electric current or voltage, and determining from the analysis the positional relationship between the elevating machine and a source of the sensed field.

The simulations may also optionally test for other scenarios and environments, such as the movement of vehicles, people and other electrically conductive objects in the vicinity of the safety system, or changes in weather conditions, which can all affect the sensed field.

In an embodiment, storing data relating to numerous patterns of sensor signals comprises running a plurality of trials in which data relating to the interaction between the elevating machine and at least one field associated with an electric current or voltage is sensed and recorded.

In an embodiment, storing data relating to numerous patterns of sensor signals comprises running a computer simulation to simulate the interaction between the elevating machine and at least one field associated with an electric current or voltage, and recording data generated by the simulation that relates to the interaction between the elevating machine and the fields associated with an electric current or voltage.

In another embodiment, the invention relates to a hazard detection device that senses an electric field in more than one axial direction using one or more sensors placed on one or more moving parts of the elevating machine, and a control system that compares information from the sensors with stored data generated from real and/or simulated test data.

The sensors may be arranged in clusters that are spaced apart around the structure of the elevating machine, preferably so each cluster (which includes, for example, sensors sensing in the X, Y and Z axial directions) is on an independent moving section of the elevating machine. Each cluster will filter signal frequencies to detect for power lines. The system will measure values at different points along the booms, in order for the system to analyse the sensed field in each degree of freedom on the elevating machine. The data from these sensors will then be processed or sent wirelessly and/or via wires to be processed by a control system. The system will compare the results from the sensors with data generated during product development.

Data may for example be generated using simulations of scenarios involving power lines and elevating machines. Computer models may be generated to simulate how an electric field will react in various scenarios. Many simulations (probably thousands) may be run using computer software, plotting the electric field strength on the clusters of sensors in each of the situations. These results can then be validated using real life testing in a safe setup of test situations. These situations may for example be based on the scenarios where electrocutions have occurred in the past, which follow similar patterns.

Each model and variation of elevating machine may require these simulations and tests to be carried out, as the variations in size, movement and conductivity of the different machines will produce different results in the same test conditions. The effect of other factors that may affect or distort the sensed field may also be simulated or tested, so that these effects can be cancelled out by the system during operation. These other factors may include for example different weather conditions, or the number of people in the operator cage or around the base of the machine, or other nearby objects such as trees, lampposts and passing vehicles.

The data generated during product development will ensure that the structure of the elevating machine and any nearby conductors distorting the sensed field will be considered by the system. The testing could also consider various weather conditions as these could also distort the sensed field.

Advantageously, the system does not trigger at a predetermined threshold value, it conducts an analysis, for example by comparing the sensed data to results it has 'seen' or learned from the simulations and validation, and determines the positional relationship of the system to a source of electric or magnetic field based on that analysis.

Embodiments of the invention may also allow for fields generated from the elevating machine itself to be taken into account. For example, if the power to cage function of a MEWP is active, an electrical field may be generated up the length of the MEWP booms, which could otherwise cause a false reading. Electric and/or magnetic fields that could affect the safety system may also for example be produced by an on-board power generator: these can also be taken into account.

Preferably the clusters of sensors will be attached to the elevating machine on each individual moving section: for example, on a MEWP one cluster may be provided on each boom section, one in the cage and one on the base. However, physically this is not always possible. In some instances the cluster may only be able to detect in one or two axial directions. This could be due to exposure and risk of damage, difficulties getting a power supply or data cable to the device, or there may not be a physical location.

Part or all of the system could attach or clamp to the elevating machine to allow for easy installation and for the device to be retrofitted. In an embodiment, the system primarily uses electric field sensors to determine the likely proximity and position of the elevating machine relative to the power lines. However, the use of one or more magnetic field sensors could be beneficial either independently from or in conjunction with the electric field sensor, particularly if trying to detect proximity to shielded cables around residential areas that are typically of lower voltage.

If the position of the elevating structure and/or the sensor positions are known, possibly through devices such as angle sensors, lasers or cylinder extension sensors, then this information can be combined with the sensed field strength to calculate the direction and proximity of a powerline.

For detecting power lines that use direct current, the sensors can move though the field to generate a signal. Through a form of vibration or oscillation, sensors can move though the electric field from the DC power lines. This signal can then be read and processed in the same way as from the other sensors and used to output a hazard signal from the processor.

When the device senses a dangerous state, for example when the device has come within the recommended safe working distance of a high voltage power line (or when it has sensed a predetermined voltage level), the device could send a signal to stop the elevating machine. Alternatively, the device could send a signal to slow the elevating machine down or allow only limited movement, for example only allow movement in a direction away from the danger or only allow certain functions. Alternatively the device could send a signal to automatically reverse at least some of the previous movements.

When the device senses a dangerous state, the device could send out a signal to cause the machine to enter a safe state, temporarily preventing machine movement and forcing the operator to review the situation. In this state, the operator would need to activate an override or reset button to acknowledge the danger and allow the machine to operate again to safely move away from danger.

The processor could also analyse the history of the electric field to see how it has changed over time and potentially predict if the danger is increasing or decreasing. This may be useful for identifying objects that are not power lines. For example if cars drive past, the system may be able to recognise a corresponding pattern. For instance if the elevating machine has not moved, but the electric field has changed for 3 seconds, the system may determine that the change in field was caused by something other than a power line or elevating machine.

The system could also be programed to know the machine envelope (i.e. the range of movement of the elevating part). Therefore if the system knows the distance and direction of the power line, it could compare this with the machine's working envelope (i.e. all possible zones the elevating structure can reach while the base part is in a static position) and indicate whether a particular area is safe. This may be particularly useful for trailer machines.

Another preferred objective of the invention is for the system to clearly alert the operator to the distance or direction of the hazard or hazards.

The system could alert users to the presence of a high voltage power cable.

The method of alert could be in the form of an audible or visible indication, and/or could use light, colour, sound, or vibration to alert the operator.

The method of informing could also be information on a screen, for example it could display: the electric field around the elevating machine, the likely points for there to be power lines, power line positions with degrees of certainty or levels of E-field surrounding the elevating machine.

The product can use 3D sounds (for example, stereo sound or surround sound) as this type of sound has been found to be most effective at acting as a warning. Increasing the intensity of a sound or using "looming" sounds can result in faster human reactions, while the use of stereo or surround sound can help the operator to identify the direction of the danger.

Activation of the device may be achieved through the operation of the elevating machine—when the machine is activated the device will begin operating and sensing. The device should fail to safe i.e. to indicate a dangerous state when the device is out of power or otherwise not responding.

The system could alert the operator when it is low on power or alternatively be supplied with power when in use, for example the device could draw power from the machine and will always be available to detect electrical hazards.

Each of the sensors (or clusters of sensors) could contain a microcontroller to process information obtained by the sensors and output a digital signal.

Alternatively, the main controller could include a main processor and the sensor units would sense the electric field and provide an audible and/or visual indication.

The main controller could be wired directly into the machine in order to communicate and draw power directly from the machine. Alternatively, it could include its own power supply for example batteries, which could be recharged, and could communicate with the machine using wireless technology, such as Bluetooth®, which is common technology for exchanging data over short distances.

The sensors could be connected to the main controller and/or elevating machine by wires to allow them to draw power from the machine, battery and/or master unit. Alternatively, they could include their own power supply for example batteries and could be recharged. The sensor units could be charged by connecting to a dock on the main unit or somewhere else on the machine. The control unit could monitor the power level of the sensor units and alert the operator if one or more of the sensor units are running low on power or if there is an error or malfunction with any of the devices. The sensors and processor unit(s) could communicate with the master unit by wires or by using wireless technology Alternatively the device could be powered by energy harvesting, energy scavenging or passive capacitive electric coupling, using heat, solar, vibration or electromagnetic energy, although these methods currently produce very little power.

To save power the device could remain dormant, or broadcast less frequently until it came within certain proximity of an electrical hazard, at which point it would be activated by the electric field.

There could be means for calibrating and testing the device by passing a local electric or magnetic field of a known strength and/or frequency nearby a sensor unit and using the control unit to verify the results. The senor units may also be frequently or constantly monitored by the control unit for technical errors, including problems with broadcasting data or inaccuracies in electric field readings.

Preferably the product will allow for future upgrades and for additional and/or alternative sensors.

An alternative method for sensing power lines could involve measuring the induced current across a component in the elevating machine and determining the strength of a nearby magnetic or electric field. This could allow for one sensor to be positioned near the bottom of the elevating machine.

According to another aspect of the invention there is provided a safety system for an elevating machine having a base part and an elevating part that is mounted on the base part and can be elevated relative to the base part, wherein the safety system includes a plurality of sensor assemblies for sensing at least one field associated with an electric current or voltage, wherein the sensor assemblies are configured to be mounted on different parts of the elevating machine, at least one data processor that is connected to receive sensor signals from the sensor assemblies, and at least one memory that stores data relating to numerous patterns of sensor signals that are associated with the interaction between the elevating machine and at least one field associated with an electric current or voltage, wherein the data processor is configured to compare the received sensor signals with the stored data and identify from the comparison the positional relationship between the elevating machine and a source of the sensed field.

According to another aspect of the invention there is provided a sensing method for use in a safety system for an elevating machine, the sensing method comprising storing data relating to numerous patterns of sensor signals that are associated with the interaction between the elevating machine and at least one field associated with an electric current or voltage, sensing at least one field associated with an electric current or voltage by means of a plurality of sensor assemblies mounted on different parts of the elevating machine, receiving sensor signals from the sensor assemblies, comparing the received sensor signals with the stored data and identifying from the comparison the positional relationship between the elevating machine and a source of the sensed field.

FIG. 1 illustrates a typical MEWP 2 comprising a base part 4 and an elevating part 6. The base part 4 comprises a chassis 8 and a set of four wheels 10. The elevating part 6 includes a rotating turret 12, an elevating boom 14 and an operator cage 16 that is mounted on the end of the boom. These parts are all conventional and will not be described in detail. It should be understood that the safety system may also be used in conjunction with any other kind of MEWP, or another kind of elevating machine.

The safety system includes a plurality of sensor assemblies 20a-20f mounted on different parts of the elevating part 6. In this example a first sensor assembly 20a is mounted on the operator cage 16, and second, third, fourth, fifth and sixth sensor assemblies 20b, 20c, 20d, 20e, 20f are mounted at various locations along the elevating boom 14. Optionally, one or more additional sensor assemblies may also be mounted on the base part 4 (not shown in this embodiment).

Each sensor assembly 20a-20f includes one or more sensors 22 for sensing electrical and/or magnetic fields. Typically, each sensor assembly 20a-20f includes a plurality of electric field sensors, although alternatively (or in conjunction) magnetic field sensors may be used. The sensors 22 may be directional, each having a sensing axis 24, and may be located in a cluster with the sensing axes aligned in different directions. For example, in FIG. 1 the first sensor assembly 20a is mounted on the base 18 of the operator cage 16 and comprises a cluster of three sensors 22.1, 22.2, 22.3 having orthogonal sensing axes 24.1, 24.2, 24.3 that are aligned respectively with the X, Z and Y directions.

The safety system also includes at least one data processor unit 26 that is connected to receive sensor signals from the sensor assemblies 20. In this embodiment the safety system includes two data processor units 26a, 26b, which receive sensor signals from the sensor assemblies 20 via wires 28. Alternatively, wireless connections may be used. In this embodiment the first data processor unit 26a is located in the operator cage 16 and the second data processor unit 26b is mounted on the turret 12. However, they may be located elsewhere.

FIG. 1 shows only one possible way to position sensor assemblies 20 comprising clusters of sensors 22 around a MEWP, although it should be understood that the sensor assemblies may be arranged differently. The boxes 26 represent possible positions for the data processor units 26. In the figure the sensors 22 and processors 26 are connected together with cables. However, some or all of these could also be connected wirelessly. The arrows 24 indicate the axes that the sensors 22 would sense along (i.e. the sensing axes).

Figure 2:
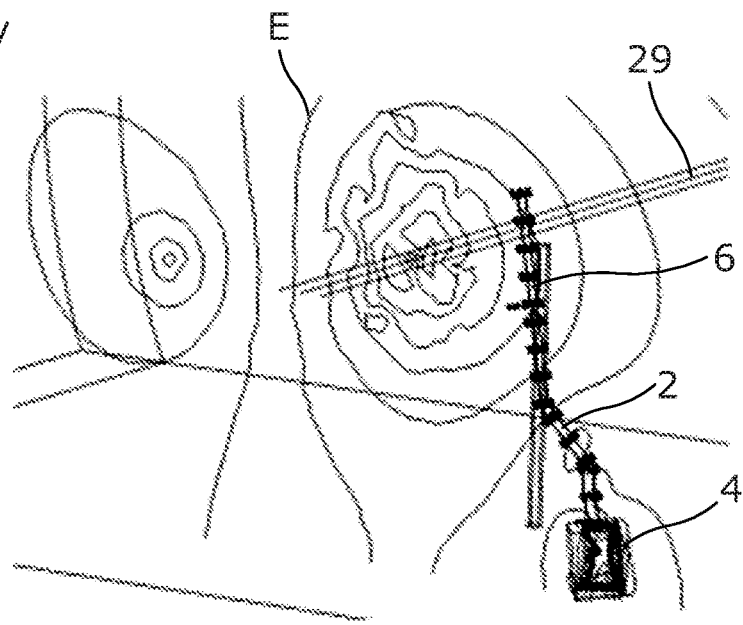
FIG. 2 is a plot of electric field strength around an electrical power line, showing logarithmically scaled lines of equal field strength, to show how the field may be distorted by a nearby MEWP.
Figure 3:
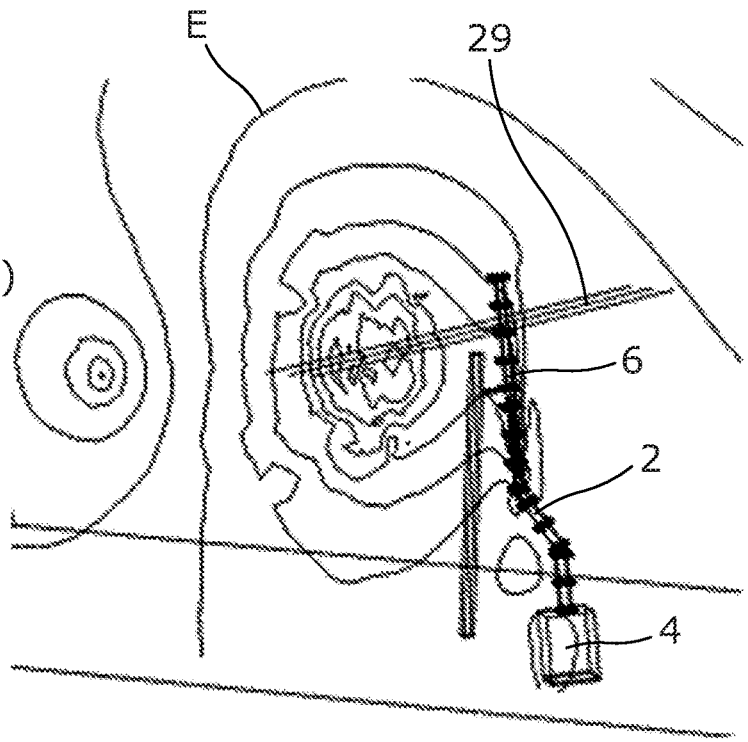
FIG. 3 is another plot of electric field strength around an electrical power line, showing how the lines of equal field strength may be altered by an adjustment in the extension of the nearby MEWP.

FIGS. 2 and 3 show the effect that a large conductor, such as a MEWP, can have on the electric field E surrounding an electrical power line 29. As can be seen in FIG. 2, when a MEWP 2 is in an electric field, it significantly distorts the field. When the position of the MEWP 2 is altered as shown in FIG. 3, so is the field. This is what causes other detectors on conventional field detectors to be unreliable and require constant calibration. The high field strength in the centre indicates the position of a power line 29. If a system knows exactly how the MEWP 2 affects the E-field or the direction of the E-field, then the position, strength and the direction of the powerline 29 can be calculated.

FIGS. 2 and 3 also illustrate the preferred requirement of the system to detect in the X, Y and Z directions. By having a system that knows how the MEWP 2 changes the direction of the E-field around the sensors, the system can also detect the direction and proximity of the powerline 29.

Figure 4:
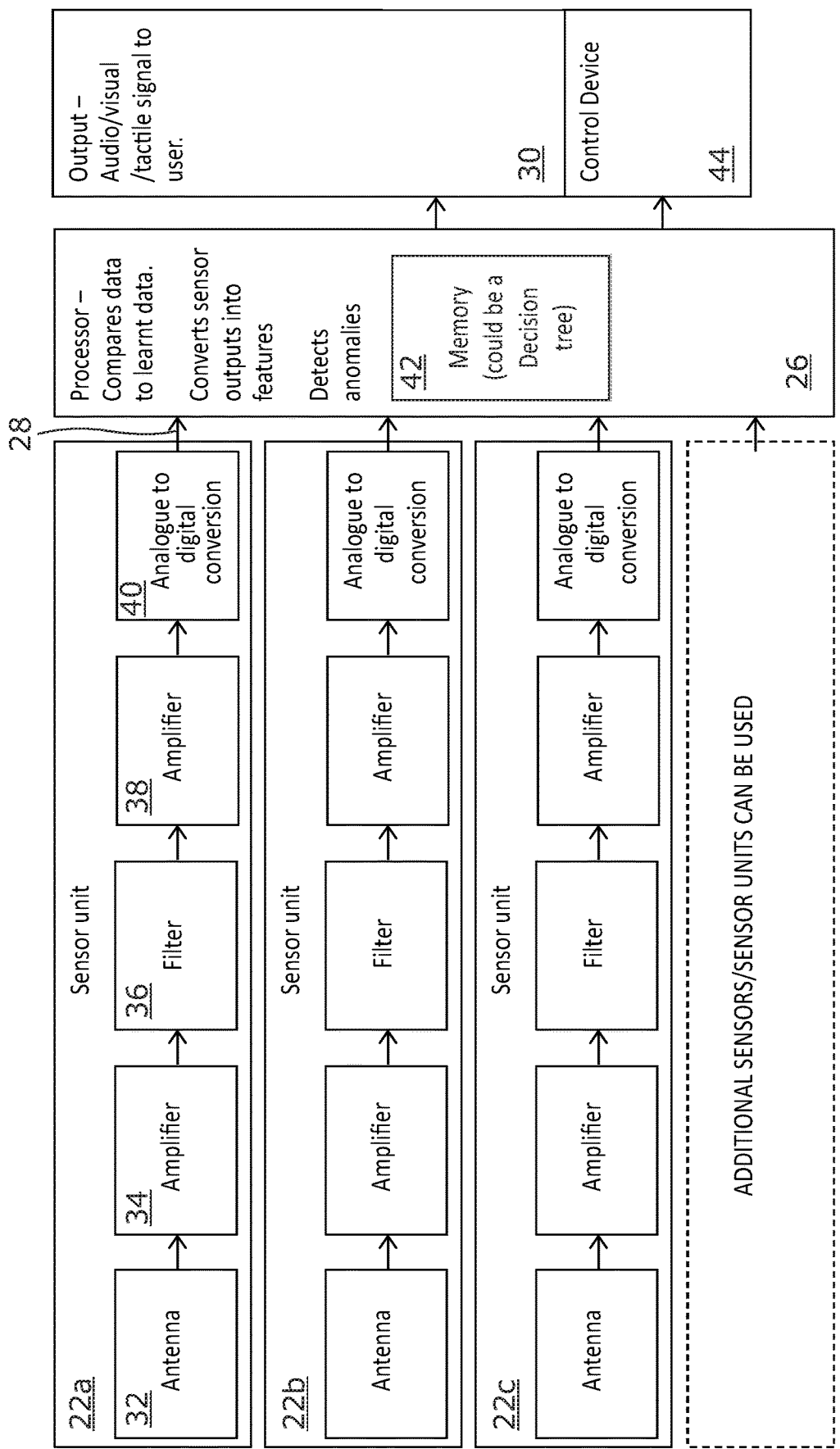
FIG. 4 is a block diagram illustrating some components of a safety system.

FIG. 4 is a block diagram illustrating some of the main components of a safety system. The system includes a plurality of sensors 22a, 22b, 22c etc., which are connected in parallel by wires 28, or wirelessly, to the data processor 26. The data processor is in turn connected to an output device 30, which can provide an output signal to an operator. The output signal may be audible, visual or tactile, or a combination of these types. As described previously, the sensors 22a,b,c etc. are generally grouped in clusters forming sensor assemblies 20, which are mounted on different parts of the MEWP 2, preferably including one sensor assembly 20 for each degree of freedom in relation to movement of the MEWP 2.

Each sensor 22a,b,c etc. comprises an antenna 32, which may for example be an electric field sensor of the D-dot type. Alternatively, a magnetic field sensor, for example a B-dot sensor, may be used. The antenna 32 is connected to an amplifier 34, which amplifies the sensor output signal. The amplified signal is then fed to a filter 36, for example a band-pass filter that passes sensor signals having a frequency of about 50-60 Hz, which is typically the frequency used for the transmission of electrical power through power lines. The output of the filter 36 is preferably connected to a second amplifier 38, which is connected to the input of an analogue to digital converter (ADC) 40.

The digital signal from the ADC 40 is transferred via wires 28 or wirelessly to the data processor 26. The data processor 26 receives sensor signals from each of the sensors 22a,b,c etc. and analyses those signals based on learned data, which may for example be stored in a memory 42 or embodied in a decision tree, as described below.

In an example, the learned data stored in the memory 42 relates to numerous patterns of sensor signals that are associated with the interaction between the MEWP 2 and one or more electric or magnetic field sources, and possibly other nearby objects (such as passing cars), and is derived either by running a plurality of trials in which data relating to the interaction between the MEWP 2 and one or more electric or magnetic field sources is sensed and recorded, or by running a computer simulation to simulate the interaction between the MEWP and one or more electric or magnetic field sources, or by a combination of trials and simulation.

The data processor 26 is configured to analyse the received sensor signals based on the learned data and identify from the analysis the positional relationship between the MEWP 2 and an electric or magnetic field source. It may do this for example by looking for a close match between the received signals and the patterns of signals stored in the memory 42, and then looking up the positional relationship information for the closest matching pattern from the data stored in the memory 42. Alternatively, a logic process, for example using decision trees, may be used to analyse the data, as described below.

Once the data processor 26 has established the positional relationship between the MEWP 2 and the electric and/or magnetic field source, it can if necessary send a signal to the output device 30, to alert the operator to a potentially hazardous situation, for example when part of the MEWP 2 comes within a predetermined distance of the field source. The predetermined distance may be set by legislation or safety standards, or selected by the operator, as required.

Alternatively, or in addition, the data processor 26 can be configured to send a signal to a control device 44, to control operation of the MEWP 2 in a potentially hazardous situation, for example when part of the MEWP 2 comes within a predetermined distance of the field source. The control device 44 may for example be configured to prevent or restrict operation of the MEWP when the data processor 26 identifies a potentially hazardous situation from the positional relationship between the elevating machine and the field source.

The control device 44 may for example be configured to prevent further movement of the MEWP, or to restrict movement of the MEWP (for example by restricting the speed of movement and/or by allowing movement only away from the electric or magnetic field source, so that the distance from the electric or magnetic field source increases, and/or by allowing only reverse movements of the MEWP), or to prevent movement of the MEWP unless the operator activates an override control.

Figure 5:
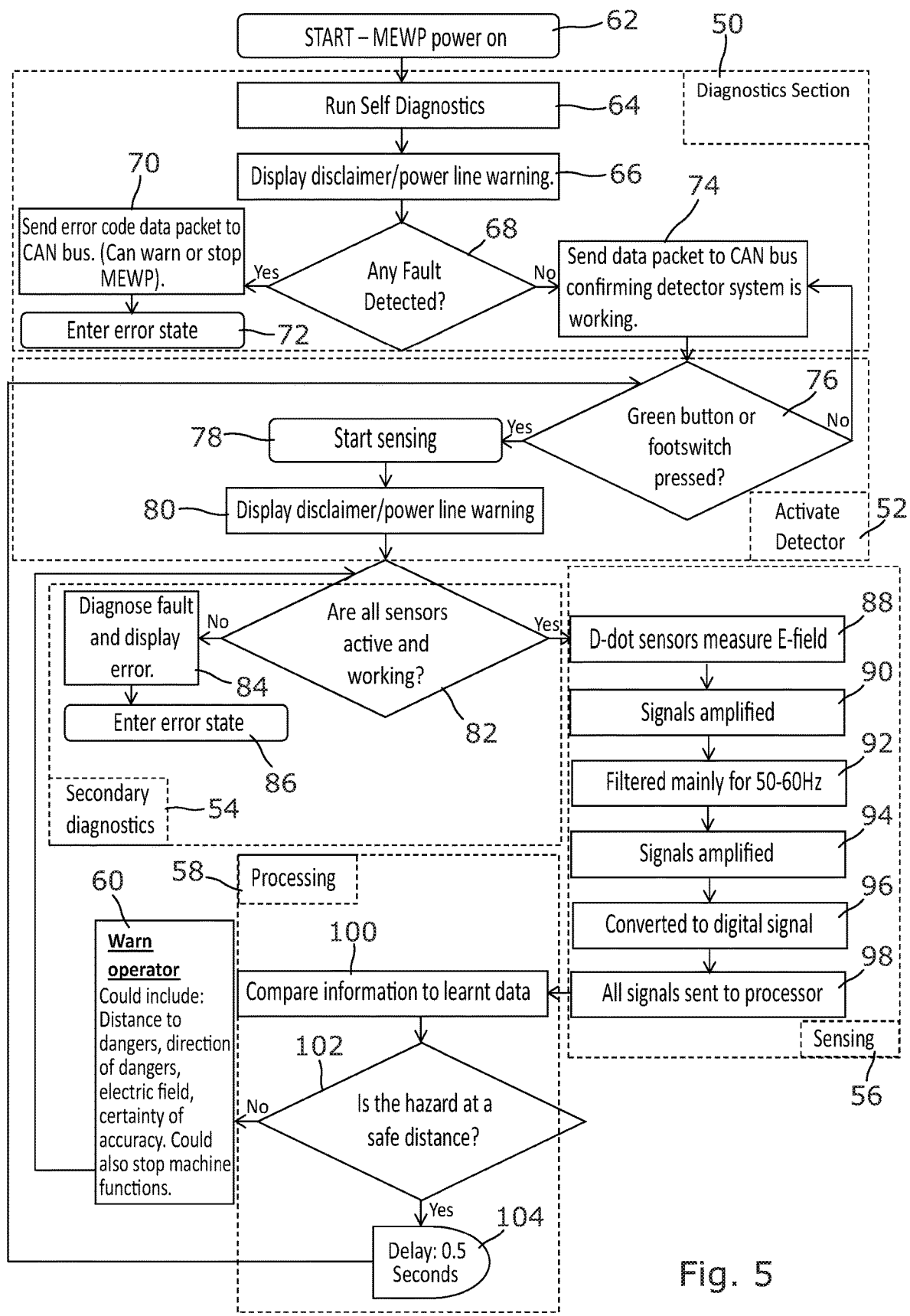
FIG. 5 is a flow diagram illustrating certain steps of a sensing method for use in a safety system.

Operation of a safety system for a MEWP according to one embodiment of the invention is illustrated in the flow diagram of FIG. 5.

The operating process comprises a primary diagnostics stage 50, a detector activation stage 52, a secondary diagnostics stage 54, a sensing stage 56, a processing stage 58 and an output stage 60.

The process starts 62 when powering on the MEWP. The primary diagnostic stage 50 then runs, which comprises running a self-diagnostics routine 64 and then displaying a disclaimer/power line warning 66. The self-diagnostics routine 64 checks for faults 68 and if a fault is detected the system sends an error code data packet to the CAN bus 70, which can provide a warning a stop the MEWP. The system then enters an error state 72. If no error is detected 68, the system sends a data packet to the CAN bus confirming that the detector system is working 74.

In the detector activation stage 52, upon receiving a no error signal 74, the system checks 76 that the "green button" or footswitch has been pressed by the operator. If not, the system recycles back to step 74. If the green button or footswitch has been pressed by the operator the system starts sensing 78 and again displays a disclaimer/power line warning 80.

In the secondary diagnostics stage 54, the system checks 82 that all the sensors 22 are active and working. If not, the system diagnoses the fault 84 and enters an error state 86.

If the system determines that all the sensors 22 are active and working 82, it enters the sensing stage 56. The antennas 32 (for example D-dot sensors) sense the electric field 88. The sensor signals are amplified 90, filtered 92 (for example for frequencies in the range 50-60 Hz), amplified again 94, converted 96 to digital signals and sent 98 to the data processor 26.

In the processing stage 58 the signals received from the sensors 22 are compared 100 to the learnt data stored in the memory 42. The system determines 102 from this comparison whether the hazard (i.e. the field source, for example an electrical power line), is at a safe distance. If it is at a safe distance, the system waits 104 for a short delay time, for example 0.5 s, then recycles to step 76 and repeats the activation, secondary diagnostics, sensing and processing stages 52, 54, 56, 58. Alternatively, a logic process, for example using decision trees, may be used to analyse the data, as described below.

If the system determines 102 that the MEWP is not at a safe distance from the field source, it sends a signal to the output device 30 and/or the control device 44 via the output stage 60. The output device 30 may provide a warning to the operator, which could include for example indications of the distance to the hazard, the direction of the hazard, the strength of the electric field and/or the certainty of accuracy. The control device 44 may stop or restrict operation of the MEWP as described previously.

The system then recycles to step 82 and repeats the secondary diagnostics, sensing and processing stages 54, 56, 58.

The system may also include other features. For example, the system may use machine learning techniques to detect anomalies, e.g. by clustering or other methods. This technique may be used to identify sensor readings that may be anomalous owing to malfunctioning sensors or a situation (either dangerous or otherwise) that was not anticipated or recognised. In such a scenario the operator may be alerted to the situation, so that he/she can assess whether the situation is safe. The outcome of this assessment can then be saved by the system so that it is able to detect and assess similar situations arising in the future.

The system may also record a 'history' of changes to the electric field to determine if there are abnormalities in the signal (such as those caused by a car driving past). It is also possible that the system may monitor external weather and/or environmental conditions, or use location sensing technology (for example GPS) to lookup local weather information. This will allow the processor to factor in these external conditions and alter its calculations accordingly.

Some optional additional features of the invention will now be discussed.

Operator Feedback—Certainty Figure.

The system may be configured to provide feedback to the operator indicating a "certainty value" relating to the degree of certainty in any indication of a potential hazard. For example a warning state could show a percentage value indicating the level of certainty of danger. Considering classification uncertainty could be used to develop a more cautious detection algorithm. For example if "safe", "warning" and "unsafe" states are all around 30% then the detector may be configured to flag the situation as an unsafe or warning state.

Increasing System Reliability with the Time Domain

Using the time domain (i.e. monitoring how signals from the sensors vary over time) in any calculations and/or processing may help to reduce the number of errors. Typically, MEWPs move towards and away from power lines, resulting in a change in the strength of the detected field that may be proportional, or linked, to the movement of the MEWP. An exception to this might be if the power line is suddenly turned on or off, or the power line detection system is not active until the MEWP is near a power line. A power line turning on or off could be detected by observing a step change in the magnetic and/or electric field. Including the time domain in machine learning could allow the system to determine whether the machine has moved towards or away from a power line, or whether the field strength has changed for some other reason (by assessing step changes, changes in gradient etc). The system could use motion based history (which requires the time domain) to evaluate the likely cause of the change in the sensed field. If the field changes, and/or the machine has not moved, then the system could 'latch' into the dangerous state, or drop into a high percentage risk of danger warning state.

Compass Wobble

The alternating current in the power line will generate a magnetic field. A physical or electronic compass can detect this magnetic field. When a MEWP is moving relative to a power line, this will change the magnetic field angle on the compass. When underneath the power line it may be possible to detect the power line 'compass' angle wobble. This information can be used to determine or confirm if a machine is close to a power line or not, and possibly if it is directly underneath a power line. It may also indicate the relative angle of the MEWP to the power line.

Ground Wire Under Power Lines.

There is a challenging scenario when a ground wire is located directly below the powerline (i.e. between the power line and ground). In this case the electric field only extends as far as the ground wire and is prevented from extending to ground. As a result, a MEWP may not detect the E-field when it is directly below the powerline. This problem may be resolved by including the time domain and monitoring changes in the E-field as the MEWP moves towards or away from the powerline, and/or by spacing field sensors wide apart enough that they can detect the field. Another solution could be using vector regression: if the system detects the distance and angle to the power line, it could classify a safe, warning or dangerous situation based on this information. For example if the power line is directly above the MEWP, an alert could be raised even if the field strength is low.

Anomaly Detection

The system could be configured to identify anomalous data—for example relating to a situation that has not been seen before, which could cause a decrease in the certainty of accurate detection. Novelty detection could be used to detect situations that have not been seen before in training data where performance may not be predictable. This can be used to maintain the quality of information presented to the operator or adjust the certainty level.

Operator Feedback—Haptic Feedback.

Alerts to the MEWP operator or others around could be in the form of haptic feedback (i.e. feedback based on the sense of touch). Tactile feedback could for example cause the controls to vibrate. Kinaesthetic haptic feedback could cause the controls to provide resistance. For example: the joystick may become harder to move as the operator gets closer to a power line or another hazard.

AC Voltage Reading Adjustment

If the voltage in the power line is not consistent, there is a possibility that the system could interpret the varying sensor signal as indicating that the proximity to the power line is changing, as well as causing secondary effects such as thinking the relative angle is changing. The system could use a smoothing technique, or something similar, to take the average reading from a range of values. It can also use other available information: for example, the system may be configured to detect that the MEWP has not moved relative to the power line (e.g. by monitoring MEWP location, geometry, hydraulic oil flow, object tracking, hydraulic pump movement or MEWP electronics). If the system determines that the MEWP has not moved relative to the power line, it can then assume the environment has changed or the amplitude of the AC voltage across the line has changed.

Sensors Used on Driverless Cars

Figure 6:
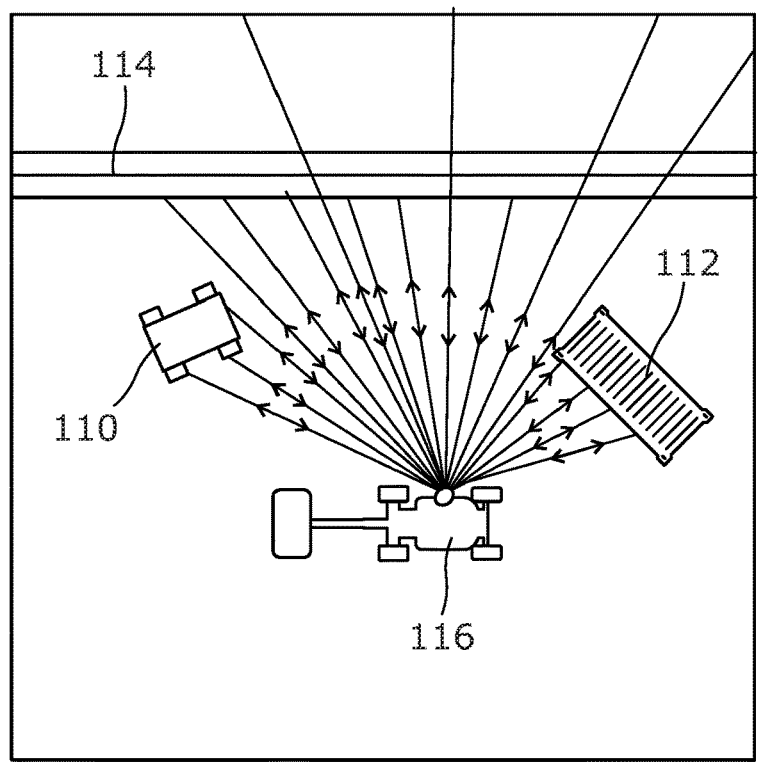
FIG. 6 is a plan view of a system that uses an additional LiDAR sensor, based on emitting and detection light.
Figure 7:
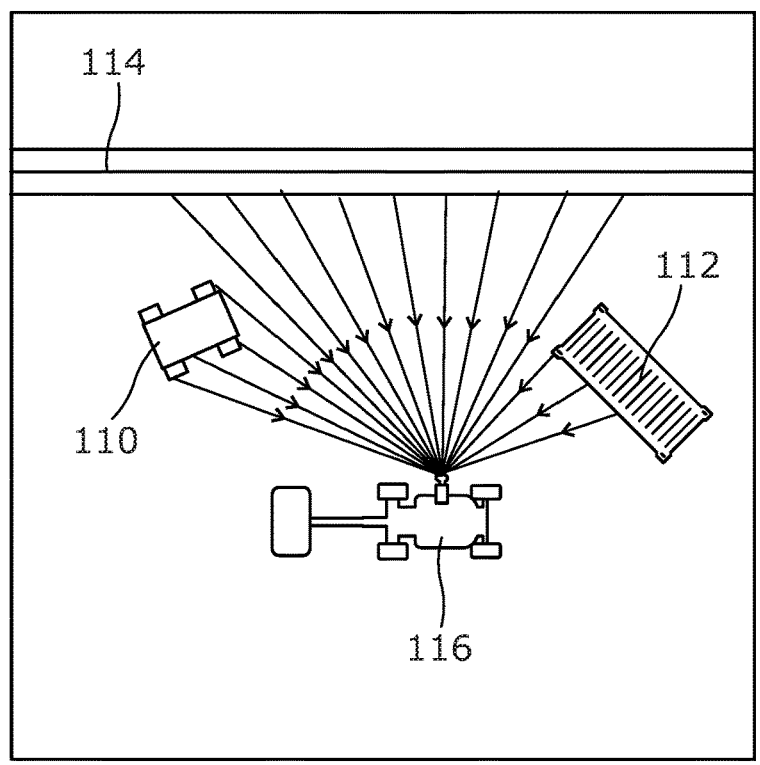
FIG. 7 is a plan view of a system that uses an additional visual sensor, such as a camera, based on receiving and detecting light.

There are also additional methods of detecting the environment which could provide a useful input to the system to increase reliability and accuracy. For example, the system may be configured to use sensors of the kind used on driverless cars, such as Light Detection and Ranging (LiDAR) (seen in FIG. 6), ultrasonic sensors, infrared sensors, lasers, short and long range radar, and visual systems (for example as seen in FIG. 7). The system could compare the observed environment with the electric and/or magnetic field data. One possible use of such a system could be to map the electric and/or magnetic field(s) to physical objects such as vehicles 110 or shipping containers 112 in the surrounding environment. For example if there is a shipping container 112 nearby and there is constantly a low field in that area, but a high strength field in the surrounding area, then the system might understand that there is an electric field drop around the object, and it could assume that there is a power line 114, but with an object of high conductivity nearby that is distorting the field. In this situation, if the MEWP 116 moves towards the shipping container 112 it could 'latch' into a dangerous state while the E-field decreases.

Dual Sensor Circuits

The system may include dual sensor circuits that operate in parallel, to ensure that the system continues to provide protection even if one of the detection circuits develops a fault.

Classification Process

An example of one process by which the data can be classified will now be described. It should be noted that other classification processes are possible and the invention is not intended to be limited to the following example.

Data can be used to analyse previous events. Data can also be used to predict future events.

This example involves gathering data with a MEWP around a powerline during testing and simulation phase (training phase).

In the testing and simulation phase, the distance from the MEWP to the powerline is known, and these distances can be classified as safe or unsafe. Each set of results can relate to a certain classification i.e. 'safe' or 'unsafe'.

The data from the training phase is used to construct a decision tree that can classify a situation as safe or unsafe by using sensor readings.

Figure 8:
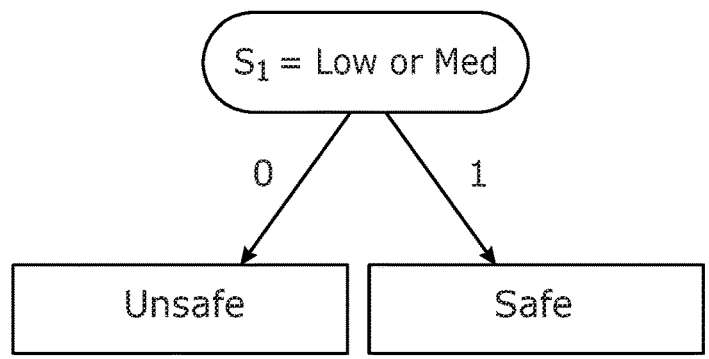
FIG. 8 illustrates a simple first decision tree.

An example of a simple decision tree is shown in FIG. 8. This decision tree is constructed from the data in table 1. The data neatly relates to the classifications, meaning there is no randomness (no entropy).

TABLE 1 theoretical data from a single electric field sensor.

| $S_1$ | Classification |
|---|---|
| Low | Safe |
| Med | Safe |
| Low | Safe |
| High | Unsafe |
| High | Unsafe |
| High | Unsafe |

In reality the MEWP distorts the electric field, meaning the results do not neatly relate to the classifications and have high randomness (high entropy). Therefore the results appear random and disorganised (see table 2 as an example).

TABLE 2

More realistic example of sensor data

| $S_1$ | Classification |
|---|---|
| Low | Safe |
| High | Safe |
| Med | Safe |
| High | Unsafe |
| Low | Unsafe |
| Med | Unsafe |

The solution to this problem is to use multiple sensors to read different areas of the electric field (likely to be many in reality, 3 will be used in this example). Table 3 shows the readings from 3 sensors. From looking at the table, it is hard to see a pattern from these signals.

TABLE 3

| $S_1$ | $S_2$ | $S_3$ | Classification |
|---|---|---|---|
| Low | Low | High | Safe |
| High | Low | Med | Safe |
| Med | Med | High | Safe |
| High | Low | High | Unsafe |
| Low | High | Med | Unsafe |
| Med | Med | Med | Unsafe |

Figure 9:
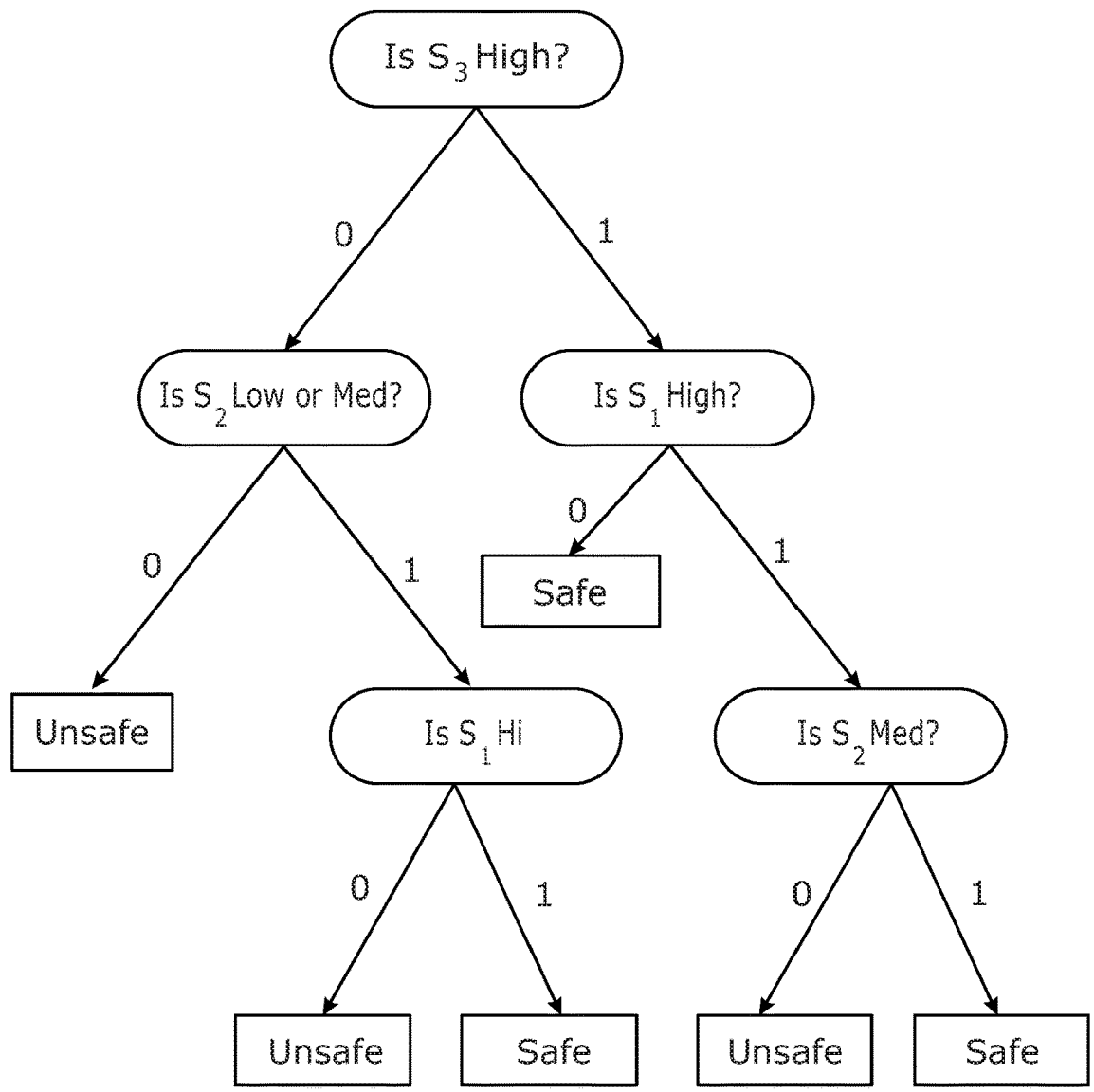
FIG. 9 illustrates a more complex second decision tree.

With more sensors, the data set grows in complexity and needs a more sophisticated system to process the data. The method used is called 'machine learning'. The software creates a decision tree, such as the example one shown in FIG. 9 (this is not an optimised decision tree, it is an example).

Calculating Entropy

The actual decision tree will be much harder to construct and will have much more data and more attributes to handle. The software to create the decision tree will use the lowest entropy attributes first to help make decisions. This is because the attributes (sensors) with the lowest entropy are the most useful when making decisions. Therefore, the entropy of each attribute must be calculated.

Table 4 shows each attribute (sensor), along with its corresponding entropies.

TABLE 4

Entropy calculation

| $S_1$ | $S_2$ | $S_3$ | Classification |
|---|---|---|---|
| Low | Low | High | Safe |
| High | Low | Med | Safe |
| Med | Med | High | Safe |
| High | Low | High | Unsafe |
| Low | High | Med | Unsafe |
| Med | Med | Med | Unsafe |
| Entropy = 1 | Entropy = 0.795 | Entropy = 0.9234 | |

Calculating Gain

It is the job of the decision tree to decrease the entropy throughout the system, resulting in an information gain by allowing the data to be categorised into 'safe' or 'unsafe'.

Constructing a decision tree is based upon finding attributes that return the highest information gain. Gain is calculated by subtracting the entropy of the attribute from the entropy of the classifications.

Figure 10:
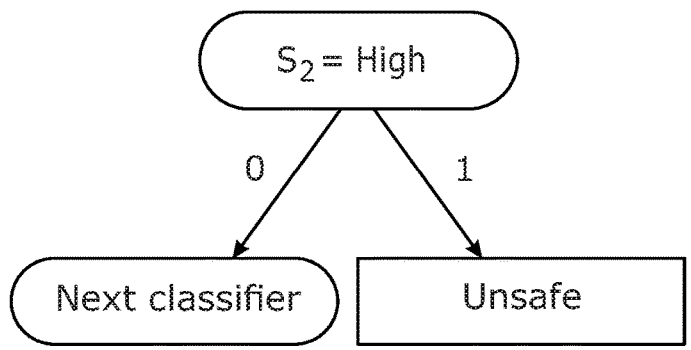
FIG. 10 illustrates a first step in a decision tree.

FIG. 10 shows the first step in the decision tree. It takes the attribute $S_2$ (from table 4) as it has the highest gain. It then uses the feature 'high' within $S_2$ to make the first decision because it has the lowest entropy.

The above process will be repeated many times and the decision tree will then grow. The goal is to create classifications with entropies of 0. It is not always possible to reach an entropy of 0. Therefore there is a level of uncertainty, which can be calculated.

System Overview

Figure 11:
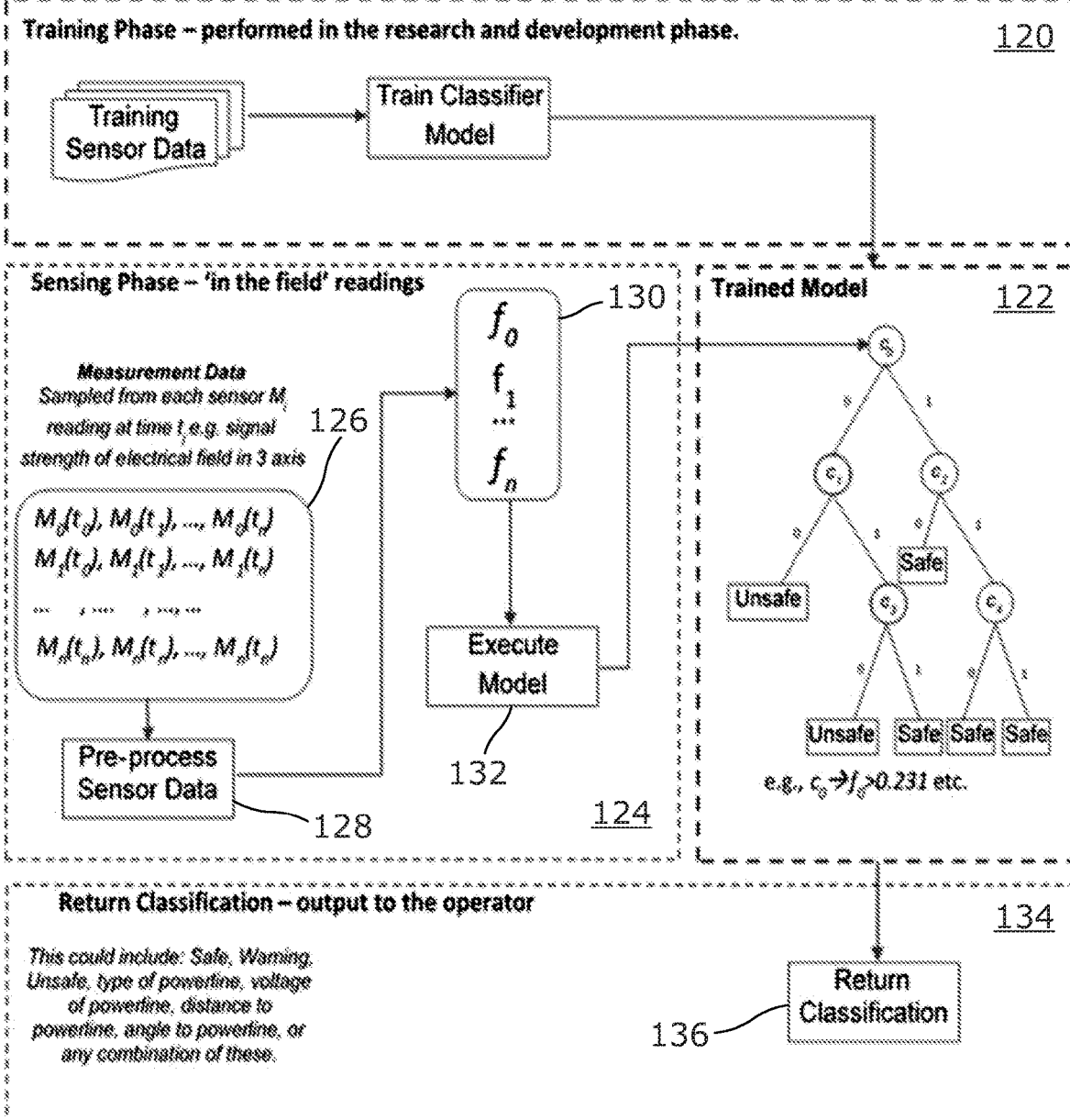
FIG. 11 is a system overview of the classification process.

FIG. 11 shows a diagram of the whole system. So far the training phase 120 and trained model 122 have been explained (highlighted with a bolder outline).

Sensing Phase

When the MEWP is in operation, the system's sensors will be taking measurements such as the electric field strength in the environment and optionally also other factors such as the temperature, humidity etc.

The sensing phase 124 in FIG. 11 includes gathering the measurement data 126 from the sensors on the MEWP. Optionally this can also include sensing other factors such as air temperature, humidity, magnetic field strength and air pressure. In the 'Pre-process sensor data' block 128, the data is pre-processed to filter out all other frequencies of electric field (other than 50 Hz and 60 Hz) and also to remove noise and smooth the signal.

Feature Data 130

On FIG. 11 the sensing phase shows a 'feature data' block 130. This is where the system converts the sensor outputs into the feature types such as 'low', 'medium' and 'high'. This feature data 130 is fed to Execute Model block 132, and is then fed as an input to the trained model 122 for example a decision tree. The output of the trained model drives the Return Classification phase 134, which provides a Return Classification signal 136 to the operator.

Figure 12:
FIGS. 12 and 13 illustrates attributes for two sensors.
Figure 13:
Figure 14:
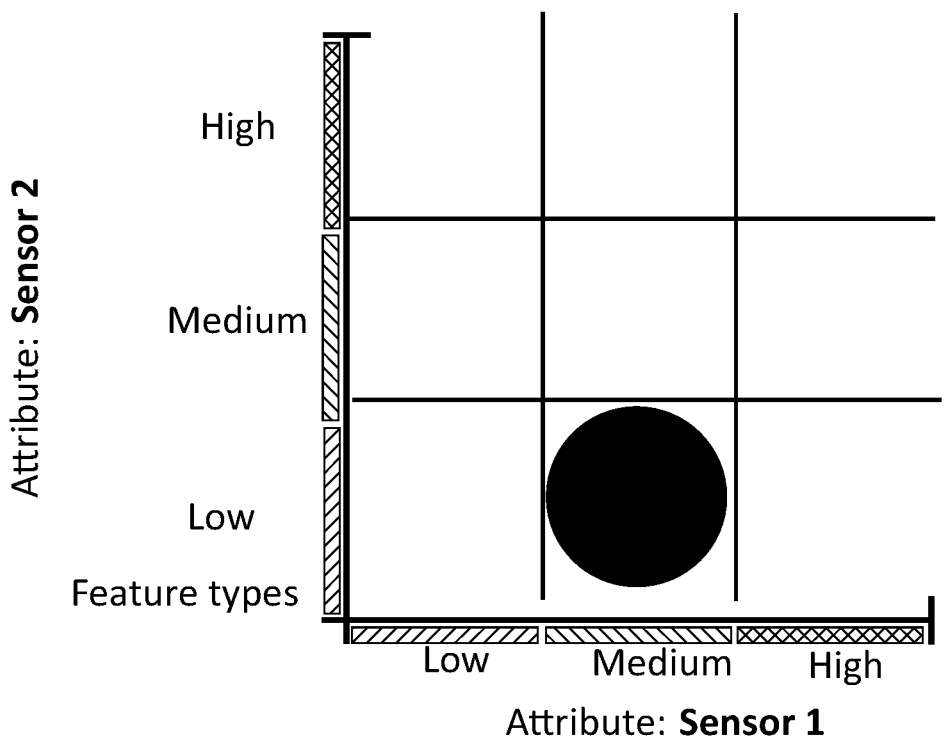
FIG. 14 represents a two-dimensional feature space for the sensor attributes illustrated in FIGS. 12 and 13.

When the two attributes shown in FIG. 12 and FIG. 13 are placed along an axis on a graph it creates a 2 dimensional 'feature space', this can be seen in FIG. 14. Each new attribute (sensor) adds an extra dimension to the feature space. A third attribute would create a three dimensional feature space. A fourth=four dimensions, fifth=five dimensions and so on. On a MEWP system it is estimated that there will typically be five sensor sites, each with up to three sensors. Other attributes including temperature, magnetic field, humidity etc. could create a feature space with more than 15 dimensions.

Feature Space Example

Figure 15:
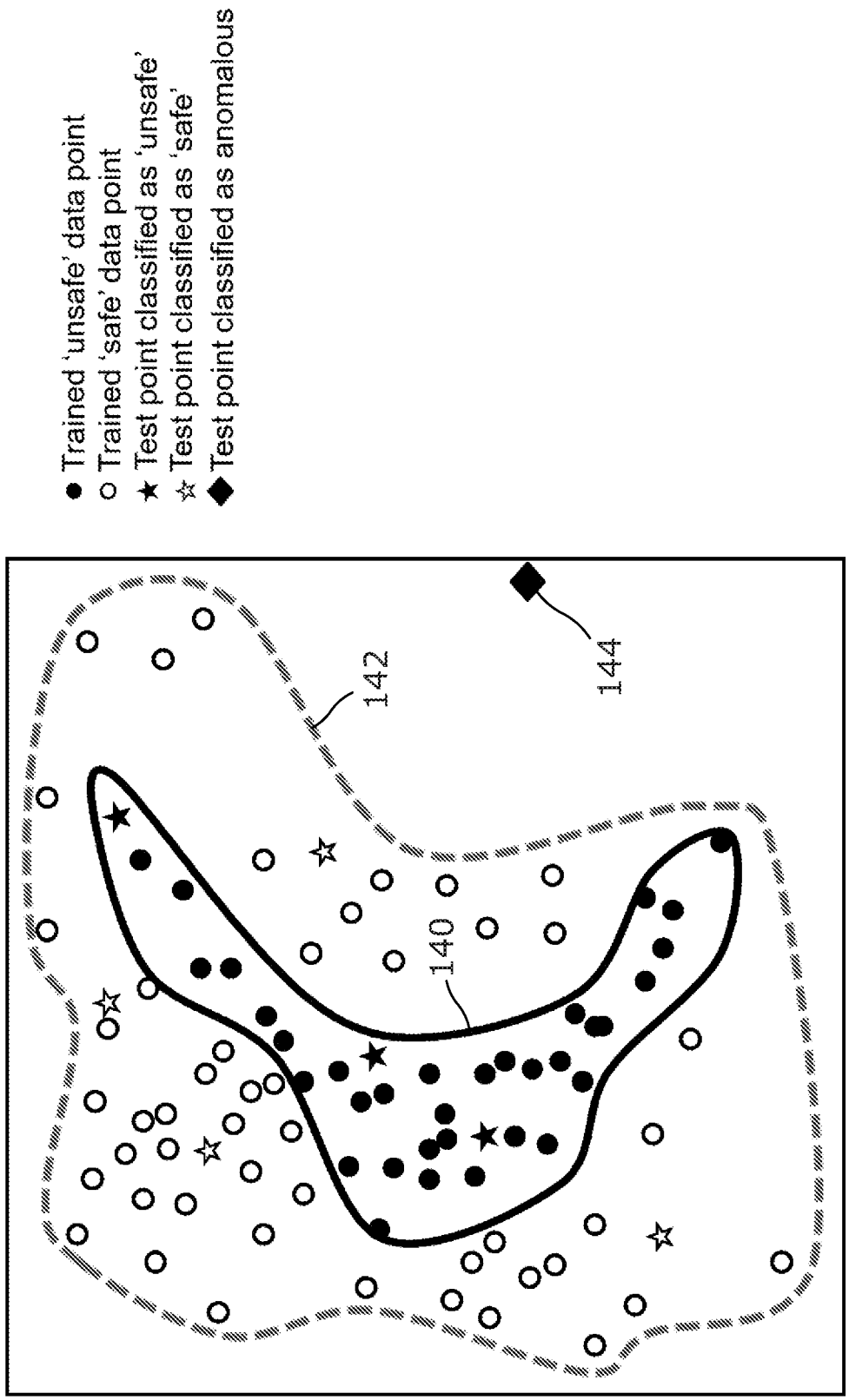
FIG. 15 represents a projection of a feature space.

It is difficult to visualise a multi-dimensional feature space, FIG. 15 shows the data points projected onto a 2D space. The system has to pick the best 'view' across the multi-dimensional feature space to create this visualisation.

The inner shape 140 shows the border of the 'unsafe region'. This representation of the data can be used to assess a safe/unsafe condition without having to store all instances of the test data. This could potentially be an alternative to the decision tree.

As the algorithm is trained by using large numbers of training scenarios, it is possible to predict performance of similar scenarios.

Novelty detection algorithms can be used to identify novel situations where the performance may not be predictable.

The outer shape 142 in FIG. 15 represents the learned frontier from the training scenarios. Features 144 outside of this frontier are said to be anomalous. This frontier 142 can be used to produce a certainty figure. For example; the operator could have a display saying the system is 70% certain they are unsafe. A decision tree could also be used to produce an uncertainty figure.

Expansion of the Classification Decision Tree

The examples shown above have 2 classifiers: 'safe' and 'unsafe'. The system can actually use finer classifications such as the distance from a powerline, for example: 0-0.5 m, 0.5 m-1 m, 1 m-1.5 m etc. The same decision tree, or a separate one could be used to classify the type of powerline, the angle to the powerlines, and other classifiers.

Regression Decision Tree

The system explained above uses classification, whereby features are created as the input into the decision tree, and specific classifications are the output. However, it is also possible to create a decision tree that uses numerical inputs and outputs. The tree performs mathematical functions on these numbers and this produces a number based output. For example the numerical value may represent the distance to the powerline. This technique is known is regression, and it is one example of another machine learning type that could be used.

Other Types of Machine Learning

Machine learning is a term that encompasses many different approaches to solving this sort of problem. Classification decision trees are just one type of machine learning system. Many different types of machine learning are possible such as artificial neural networks.

SUMMARY

In a non-limiting embodiment the system optionally has one or more of the following features:

The MEWP distorts the Electric field—resulting in the use of multiple sensors to detect more of the field.

A 'training' phase is conducted during research and development to see how the MEWP distorts the field around different power lines.

In one embodiment, the sensor outputs can be turned into 'feature data' where the numbers are converted into features such as 'low', 'med' or 'high' (Finer feature categories can also be used).

These features can be plotted onto a 'feature space' which allow patterns to be observed. These 'patterns' can be used to judge if the MEWP is in a 'safe' or 'unsafe' state (finer classifications can also be used).

The feature space can also be used to detect anomalies, for example, this could produce a figure of a percentage of certainty that the classification 'safe' or 'unsafe' is correct.

Classification decision trees are a method of machine learning that could be used to take the training data and create a system that allows the MEWP to assess the current situation and make a decision based upon the previous test data. The decision tree 'grows' by using the most ordered data to make the first decisions and aiming to get the entropy of each attribute to zero.

Decision trees could also be used to categorize distances to the powerlines, type of powerline, direction of powerline and certainty of the prediction.

The decision tree is likely to be stored in a memory, for example a tree that maps sensors to a set of conditions. However, it could also be 'hard-coded' into the system's software.

What is claimed is:

1. A safety system for an elevating machine comprising a base part and an elevating part that is mounted on the base part and is elevatable relative to the base part, wherein the safety system comprises a plurality of sensor assemblies for sensing at least one field associated with an electric current or voltage, wherein the sensor assemblies are configured to be mounted on different parts of the elevating machine, at least one data processor that is connected to receive sensor signals from the sensor assemblies, wherein the data processor is configured to obtain an analysis by analyzing the sensor signals based on learned data relating to numerous patterns of sensor signals associated with the interaction between the elevating machine and at least one field associated with the electric current or voltage, wherein the data processor is configured to determine from the analysis a positional relationship between the elevating machine and a source of the sensed field.

2. The safety system according to claim 1, comprising an alarm device that is configured to provide an alarm signal when the data processor identifies a potentially hazardous situation from the positional relationship between the elevating machine and the source of the sensed field.

3. The safety system according to claim 1, comprising at least one control device that is configured to prevent or restrict operation of the elevating machine when the data processor identifies a potentially hazardous situation from the positional relationship between the elevating machine and the source of the sensed field.

4. The safety system according to claim 1, wherein at least one of the sensor assemblies comprises a plurality of directional sensors, each having a different sensing axis.

5. The safety system according to claim 4, wherein at least one of the sensor assemblies comprises at least three directional sensors, having orthogonal sensing axes.

6. The safety system according to claim 1, comprising at least three sensor assemblies, wherein at least one of the sensor assemblies is configured to be mounted on the base part of the elevating machine, and at least one of the sensor assemblies is configured to be mounted on the elevating part.

7. The safety system according to claim 1, wherein each sensor assembly comprises at least one electric field sensor.

8. The safety system according to claim 1, wherein each sensor assembly comprises an electrical filter that is configured to pass an alternating signal having a frequency in the range 50-60 Hz.

9. The safety system according to claim 1, wherein the data processor is configured to identify from the received sensor signals a distance from the elevating machine to the source of the sensed field.

10. The safety system according to claim 1, wherein the data processor is configured to identify from the received sensor signals a direction from the elevating machine to the source of the sensed field.

11. The safety system according to claim 1, including a memory that stores data relating to the effects of various external factors on the received sensor signals, and wherein the data processor is configured to compensate for the effect of these external factors.

12. An elevating machine comprising a base part and an elevating part, and a safety system according to claim 1, wherein the sensor assemblies are mounted on different parts of the elevating machine.

13. The elevating machine according to claim 12, comprising at least three sensor assemblies, wherein at least one of the sensor assemblies is mounted on the base part of the elevating machine, and at least one of the sensor assemblies is mounted on the elevating part.

14. The elevating machine according to claim 12, wherein the elevating machine is a mobile elevating work platform, a forklift truck, a telescopic handler, a rescue vehicle, an off highway construction machine or an agricultural machine.

15. The elevating machine according to claim 14, wherein the elevating machine is the mobile elevating work platform having the base part and the elevating part that comprises an operator platform, wherein at least one of the sensor assemblies is mounted on the operator platform.

16. A sensing method for a safety system for an elevating machine, the sensing method comprising:
sensing at least one field associated with an electric current or voltage by a plurality of sensor assemblies mounted on different parts of the elevating machine,
receiving sensor signals from the sensor assemblies,
obtaining an analysis by analyzing the sensor signals based on learned data relating to numerous patterns of sensor signals associated with the interaction between the elevating machine and at least one field associated with the electric current or voltage, and
determining from the analysis a positional relationship between the elevating machine and a source of the sensed field.

17. The sensing method according to claim 16, including storing data relating to numerous patterns of sensor signals, wherein said storing data comprises running a plurality of trials in which data relating to the interaction between the elevating machine and at least one field associated with the electric current or voltage is sensed and recorded.

18. The sensing method according to claim 17, including storing data relating to numerous patterns of sensor signals, wherein said storing data comprises running a computer simulation to simulate the interaction between the elevating machine and at least one field associated with the electric current or voltage, and recording data generated by the simulation that relates to the interaction between the elevating machine and the at least one field associated with the electric current or voltage.

19. The sensing method according to claim 16, including storing data relating to numerous patterns of sensor signals, wherein said storing data comprises running a computer simulation to simulate the interaction between the elevating machine and at least one field associated with the electric current or voltage, and recording data generated by the simulation that relates to the interaction between the elevating machine and the at least one field associated with the electric current or voltage.

20. A safety system for an elevating machine comprising a base part and an elevating part that is mounted on the base part and is elevated relative to the base part, wherein the safety system comprises a plurality of sensor assemblies for sensing at least one field associated with an electric current or voltage, wherein the sensor assemblies are configured to be mounted on different parts of the elevating machine, at least one data processor that is connected to receive sensor signals from the sensor assemblies, wherein the data processor is configured to obtain an analysis by analyzing the sensor signals based on learned data relating to numerous patterns of sensor signals associated with the interaction between the elevating machine and at least one field associated with the electric current or voltage, wherein the data processor is configured to determine from the analysis a positional relationship between the elevating machine and a source of the sensed field, wherein each sensor comprises an electrical filter that is configured to pass an alternating signal having a frequency in the range 50-60 Hz.

21. A safety system for an elevating machine comprising a base part and an elevating part that is mounted on the base part and is elevated relative to the base part, wherein the safety system comprises a plurality of sensor assemblies for sensing at least one field associated with an electric current or voltage, wherein the sensor assemblies are configured to be mounted on different parts of the elevating machine, at least one data processor that is connected to receive sensor signals from the sensor assemblies, wherein the data processor is configured to obtain an analysis by analyzing the sensor signals based on learned data relating to numerous patterns of sensor signals associated with the interaction between the elevating machine and at least one field associated with the electric current or voltage, wherein the data processor is configured to determine from the analysis a positional relationship between the elevating machine and a source of the sensed field, wherein storing data relating to numerous patterns of sensor signals comprises running a computer simulation to simulate the interaction between the elevating machine and at least one field associated with the electric current or voltage, and recording data generated by the simulation that relates to the interaction between the elevating machine and the at least one field associated with the electric current or voltage.

* * * * *